United States Patent
Dunsmore et al.

(10) Patent No.: US 7,038,465 B2
(45) Date of Patent: May 2, 2006

(54) SYSTEM AND METHOD FOR CALIBRATING BALANCED SIGNALS

(75) Inventors: Joel P. Dunsmore, Sebastopol, CA (US); Brian LeMay, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 115 days.

(21) Appl. No.: 10/405,533

(22) Filed: Apr. 2, 2003

(65) Prior Publication Data

US 2004/0196051 A1 Oct. 7, 2004

(51) Int. Cl.
*G01R 35/00* (2006.01)

(52) U.S. Cl. ...................................... 324/601

(58) Field of Classification Search ................ 324/601, 324/605, 622; 332/103; 375/298
See application file for complete search history.

(56) References Cited

U.S. PATENT DOCUMENTS

| | | | | |
|---|---|---|---|---|
| 3,226,651 A | * | 12/1965 | Ishimoto et al. ................ 330/2 |
| 5,081,647 A | * | 1/1992 | Bremer ........................ 375/216 |
| 5,099,200 A | * | 3/1992 | Tarantino et al. ............ 324/619 |
| 5,371,481 A | * | 12/1994 | Tiittanen et al. ............ 332/103 |
| 5,499,394 A | * | 3/1996 | Kaatz et al. ................. 455/266 |
| 5,530,722 A | * | 6/1996 | Dent ........................... 375/298 |
| 5,663,691 A | * | 9/1997 | Kowalik et al. ............ 332/103 |
| 5,939,951 A | * | 8/1999 | Bateman et al. ............ 332/103 |
| 6,208,698 B1 | * | 3/2001 | Marchesani et al. ........ 375/298 |
| 6,850,113 B1 | * | 2/2005 | Amano ........................ 329/315 |

OTHER PUBLICATIONS

IEEE 100 The Authoritative Dictionary of IEEE Standard Terms, Seventh Edition. Published by IEEE Press. 2000 (pp. 246,247).*

IEEE 100, The Authoritative Dictionary of IEEE Standard Terms, Seventh Edition, IEEE Press, p. 81.*

D. E. Bockelman, W. R. Eisenstadt, "Combined differential and Common-Mode Scattering Parameters: Theory and Simulation", IEEE Transactions on Microwave Theory and Techniques, vol. 43, No. 7, Jul. 1995, pp. 1530-1539.

D. E. Bockelman, W. R. Eisenstadt, "Pure-Mode Network Analyzer for On-Wafer Measurements of Mixed-Mode S-Parameters of Differential Circuits",IEEE Transactions on MTT, vol. 45, No. 7, Jul. 1997, pp. 1071-1077.

D. E. Bockelman, W. R. Eisenstadt, "Calibration and Verification of the Pure-Mode Vector Network Analyzer", IEEE Transactions on MTT, vol. 46, No. 7, Jul. 1998, pp. 1009-1012.

D. E. Bockelman, W. R. Eisenstadt, R. Stengel, "Accuracy Estimation of Mixed-Mode Scattering Parameter Measurements", IEEE Transactions on Microwave Theory and Techniques, vol. 47, No. 1, Jan. 1999, pp. 102-105.

* cited by examiner

*Primary Examiner*—Anjan Deb

(57) ABSTRACT

The power differential between balanced signals is measured and the resultant level is used to control the phase between the signals. In one embodiment, I and Q inputs to vector modulator is adjusted to control the phase.

22 Claims, 4 Drawing Sheets

SYSTEM AND METHOD FOR CALIBRATING BALANCED SIGNALS

CROSS-REFERENCE TO RELATED APPLICATIONS

The present application is related to concurrently filed, and commonly assigned U.S. Pat. No. 6,768,390, entitled "SYSTEM AND METHOD FOR GENERATING BALANCED MODULATED SIGNALS WITH ARBITRARY AMPLITUDE AND PHASE CONTROL USING MODULATION"; and co-pending U.S. patent application Ser. No. 10/405,556, entitled "SYSTEM AND METHOD FOR GENERATING BALANCED SIGNALS WITH ARBITRARY AMPLITUDE AND PHASE CONTROL USING MODULATION", the disclosures of which are hereby incorporated herein by reference.

TECHNICAL FIELD

This invention relates to signal calibration systems and more particularly to systems and methods for calibrating balanced signals.

BACKGROUND OF THE INVENTION

In situations where balanced signals are created, such as, for example, as shown in the above-identified patent applications, it is sometimes necessary to calculate the phase between two sources. FIG. 2 shows the uncorrected phase (graph 201) of one output relative to the other. Thus, at a phase setting of 45° (point 202), the phase difference between the signals is slightly over 7°, while at a phase setting of 90° (point 203) the phase differences is 1° in the opposite direction. At approximately 180° (point 204) the signals are in phase. Thus, there maybe any arbitrary amount of phase offset between the signals. The phase offset, and phase error, can result in measurement errors. For example, a common mode signal will appear on a differential mode measurement.

FIG. 3 shows the result of correcting the phase, where the phase correction resolution is 1°. The original phase relationship is shown as 201. As expected, the resulting phase output 301 is corrected to less than 1° (½° on either side of zero).

One solution to the problem of error in differential (balanced) drives is to measure the phase deviation and create a correction function to program into a vector modulator such that the correct phase is created for the desired phase setting. The phase of signals is easily measured for continuous wave (CW) signals, but if the signals are modulated, the phase of one relative to the other is difficult to measure. In this case, a second method may be used to establish the phase relationship. In this second method, the differential outputs are combined, and the resulting signal is measured on a signal analyzer or power meter. The phase setting is modified until a minimum signal is obtained. This minimum signal is mapped to phase output of 180°. Other phases may be obtained by programming a differential phase number into the vector modulator used to create the phase difference of the two outputs.

BRIEF SUMMARY OF THE INVENTION

The power differential between balanced signals is measured and the resultant level is used to control the phase between the signals. In one embodiment, I and Q inputs to a vector modulator are adjusted to control the phase. The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
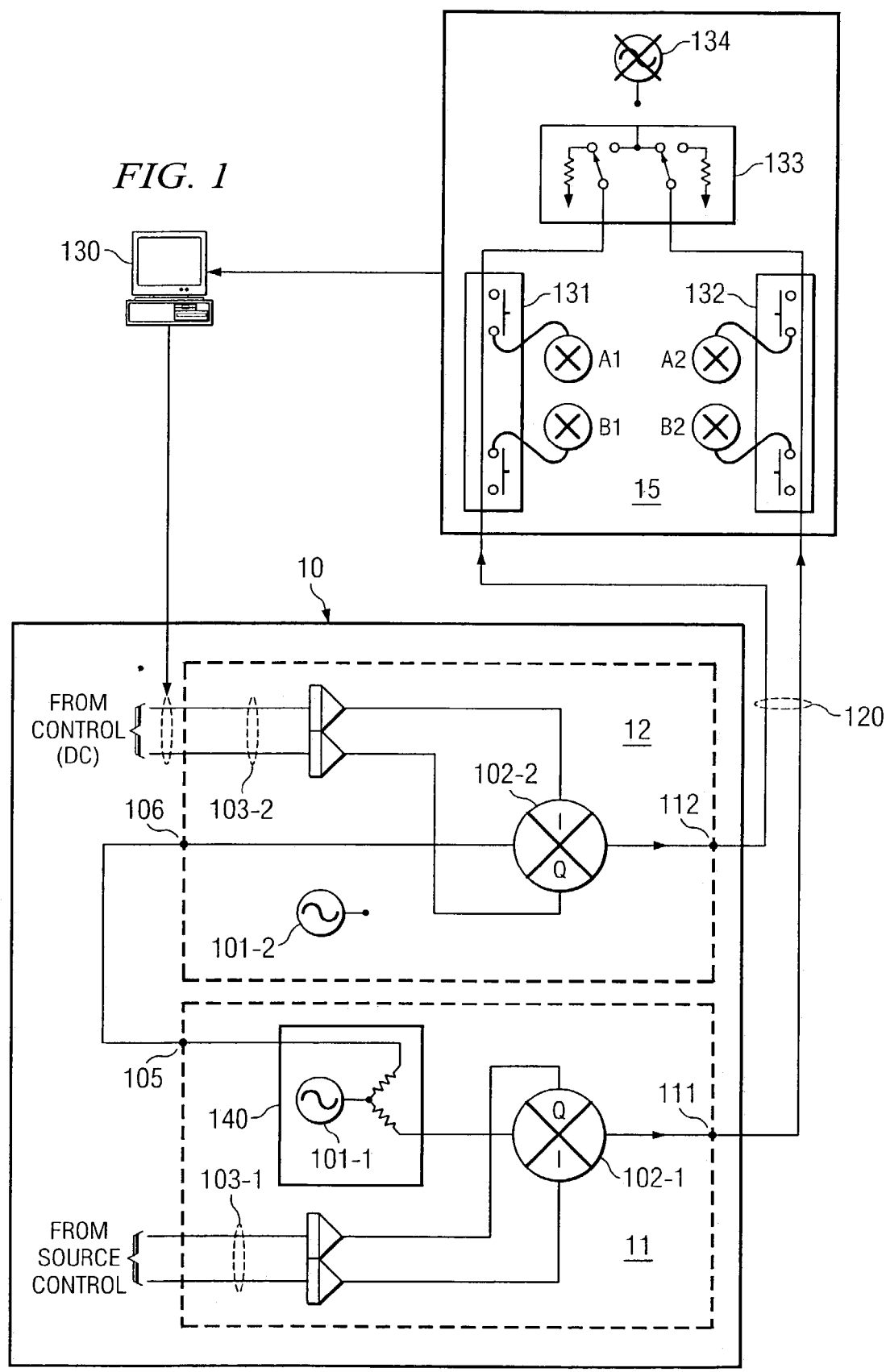
FIG. 1 shows a block diagram of a system and method used for calibration of differential inputs.

FIG. 1 shows system 10 having electronic signal generators (ESG) 11 and 12, each of which provide complex signals using a vector modulator and an arbitrary waveform generator. ESGs 11 and 12 are available as Agilent part number E4438B or equivalent. The signal source is created by synthesizer 101-1 which produces a continuous wave (CW) frequency signal. This signal is split, using splitter 140, a portion of the signal is routed to node 105 and portion of this same signal is also routed to vector modulator 102-1. The portion of the signal going to node 105 is referred to as the coherent carrier.

Vector modulator 102-1, under direction of I and Q inputs 103-1, controls the amplitude and phase of the output signal which is present on node 111 of ESG 11. This output signal is phase coherent with the signal on node 105.

In one implementation, the node 105 signal is routed to node 106 of ESG 12. ESG 12 is a modified version of ESG 11 where a means has been provided to bypass internal synthesizer 101-2 to allow an external signal to be applied to connect node 106 to vector modulator 102-2 of ESG 12. This allows the coherent carrier signal on node 106 from ESG 11 to be applied to vector modulator 102-2 of ESG 12.

I and Q inputs 103-2, which advantageously are controllable DC inputs, selectively control vector modulator 102-2 thereby controlling the signal amplitude or phase of the coherent carrier as it is presented to node 112. Thus, node 112 has on it a signal which is both amplitude and phase adjusted and which is phase coherent relative to the signal on node 111. Accordingly, differential output 120 contains signals which are differentially balanced and which are amplitude and phase controlled relative to each other.

Figure 2:
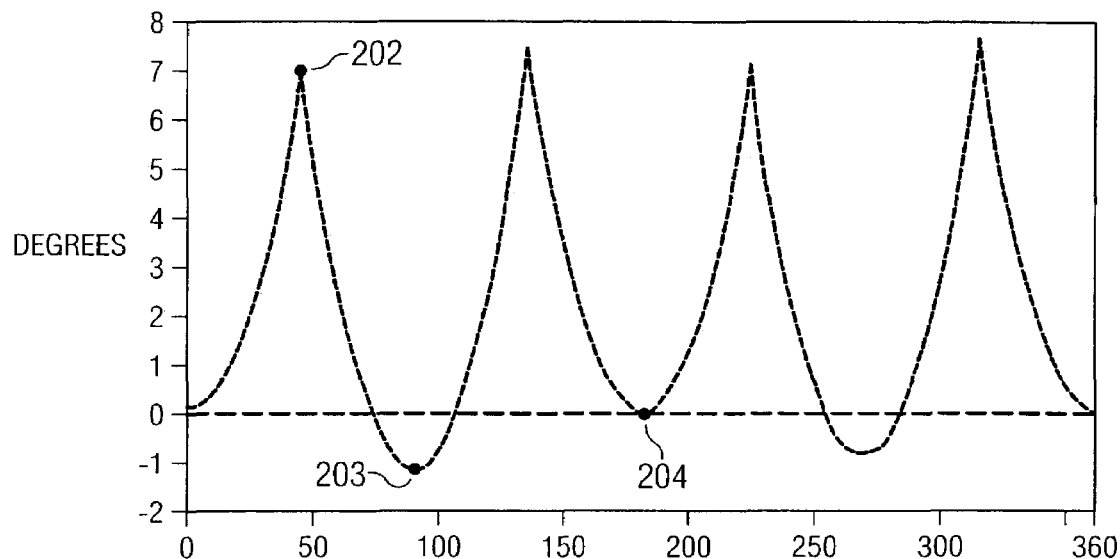
FIG. 2 is a graph showing the initial phase accuracy between two signals.

The relative phase and amplitude of outputs 111 and 112 (as shown in FIG. 2) may be measured on test systems, such as vector network analyzer (VNA) 15 or vector voltmeters. VNA 15 is shown being used as a tuned receiver. The VNA is first calibrated by splitting one signal through a known power splitter, and measuring the relative amplitude and phase between outputs 111 and 112, for example, on computer 130. This may be repeated at a multitude of frequencies as controlled by signal source 101-1 to create a VNA calibration array.

FIG. 2 shows the phase (graph 201) of output 111 compared to output 112, as a function of the desired phase setting. Thus, at a phase setting of 45° (point 202), the phase difference between signals 111 and 112 is slightly over 7°, while at a phase setting of 90° (point 203) the phase difference is 1° in the opposite direction. At approximately 180° (point 204) the signals are in phase.

Figure 3:
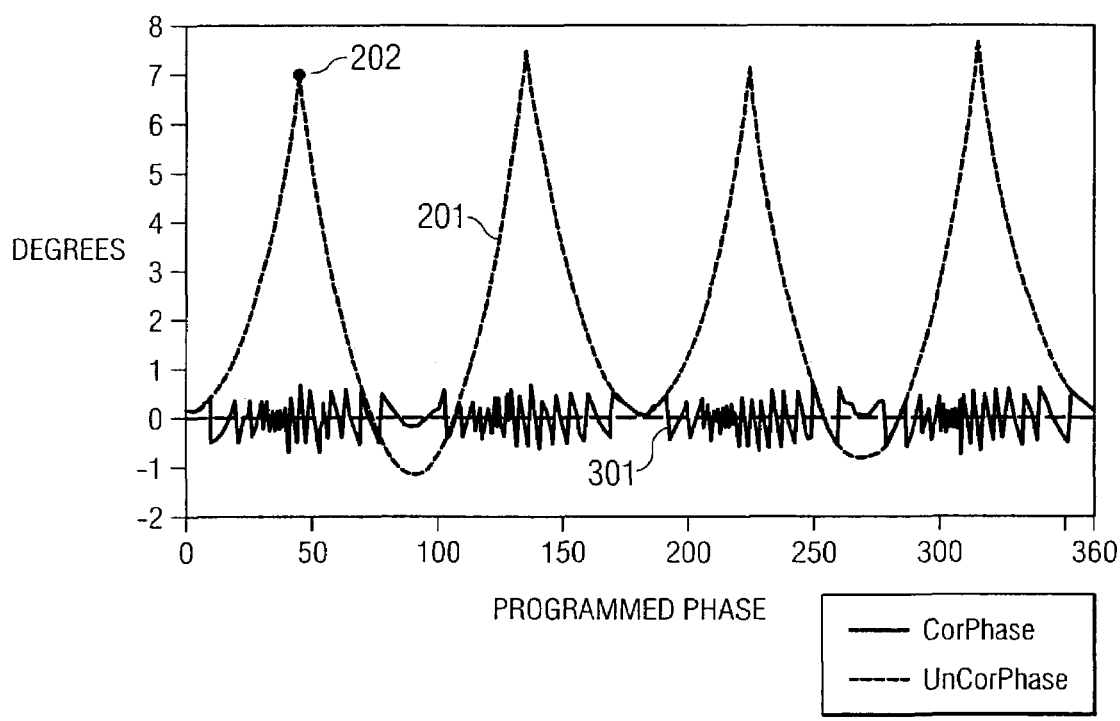
FIG. 3 is a graph showing phase accuracy after calibration.

In order to achieve a correction array (as shown in FIG. 3), outputs 111, 112 of differential source 120 are connected to the two inputs of the VNA, and the phase difference of the source is changed under control of processor 130 and controllable DC I and Q inputs 103-2 through a desired phase range (e.g. 0–360°).

A correction array is created that is the inverse of the measured data, such that when a desired phase is chosen, the phase setting of the ESG is changed by the correction array such that the correct output phase is achieved. Waveform 301, of FIG. 3, shows the result of correcting the phase, where the phase correction resolution is 1°. The original phase relationship is shown as 201. As expected, the resulting phase output 301 is corrected to less than 1° (½° on either side of zero).

Although many algorithms may be used, this example uses the algorithm of setting the phase every 1°, and measuring the resulting output phase, to create a correction table. When a desired phase is chosen, the table is searched for the phase setting that most closely results in the desired phase output. Many other algorithms could be developed including curve fitting of the table data, linear interpolation, etc.

It is difficult to measure the phase difference between modulated signals. If the signals are sinusoidal, such as TOI, the method described with respect to FIGS. 1–3 will be sufficient to create a phase relationship by measuring the individual tones. If the modulated signal is complex, such as CDMA, it is not possible to measure the phase of the signals using a VNA. It is possible that a CW modulation can be applied to create the phase reference, then the modulation changed to the complex format, but experiments indicated that there may be a phase shift when changing modulation formats.

Figure 4:
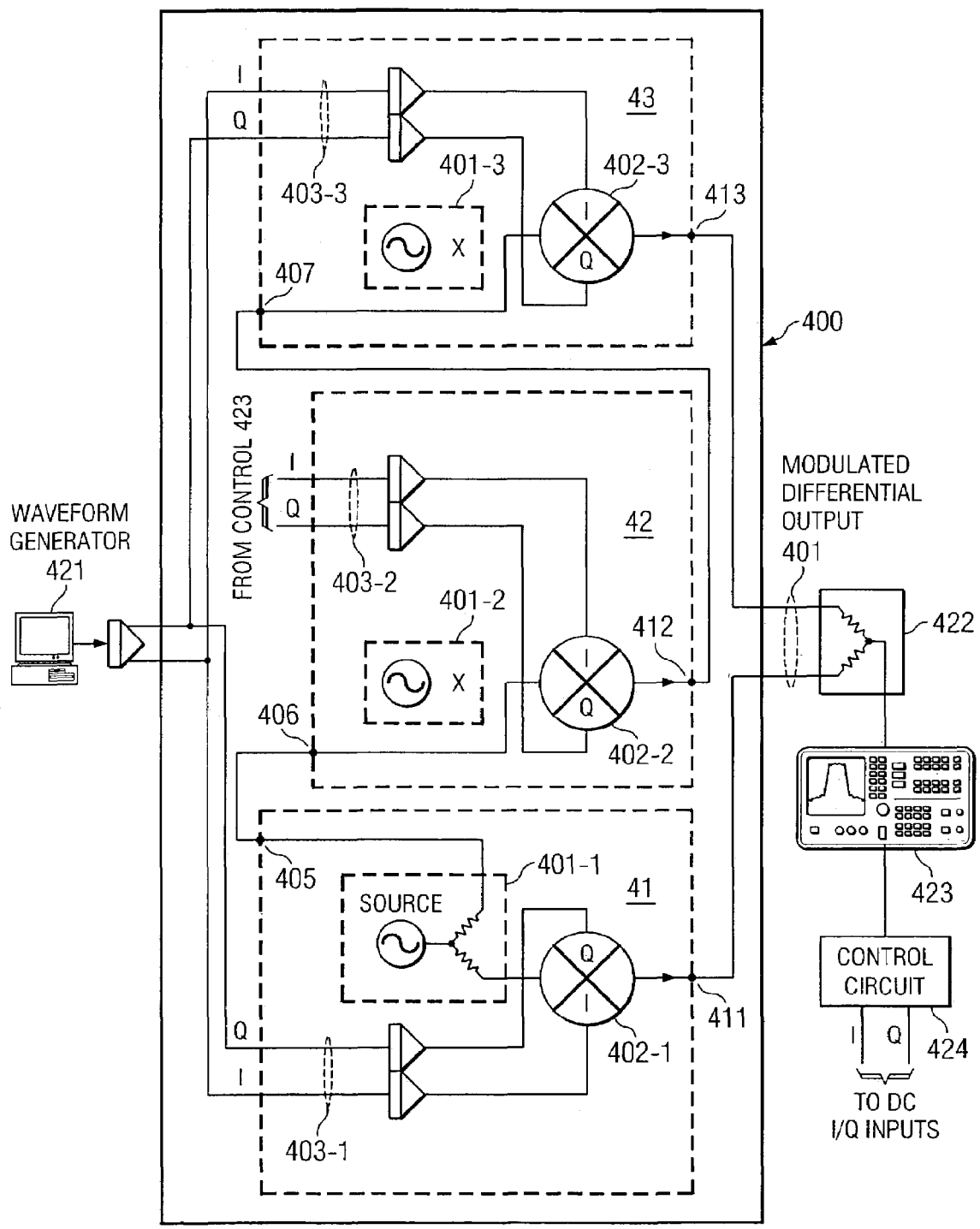
FIG. 4 shows a block diagram of a system and method combining a differential balanced source for the purpose of calibration.

FIG. 4 shows one system and method for measuring the phase difference between modulated signals by combining modulated differential outputs 401, from circuit 40, such as by using power splitter 422, and sending the combined signal to spectrum analyzer 423, or to another measuring receiver.

Circuit 40, in one embodiment, uses these ESGs 41, 42, and 43. ESGs 41 and 42 operate as discussed above for ESGs 11 and 12, respectively, and ESG 43, which is modulated in the same manner as is ESG 41 on its inputs 403-1. Thus, since arbitrary generator 421 provides the same signal to vector modulators 402-1 and 402-3, the modulation envelope of outputs 411 and 413 is identical, and only the phase of the carrier is affected. Control circuit 424 works in conjunction with spectrum analyzer 423 to change the controllable DC I and Q inputs 403-2 to ESG 42.

The phase offset between outputs 411 and 413 is programmed over its range of values, and the programmed value for the minimum amplitude is mapped to 180°. For this value, and for the correction derived by the system and method shown in FIGS. 1 through 3, any value of phase may be obtained.

Figure 5:
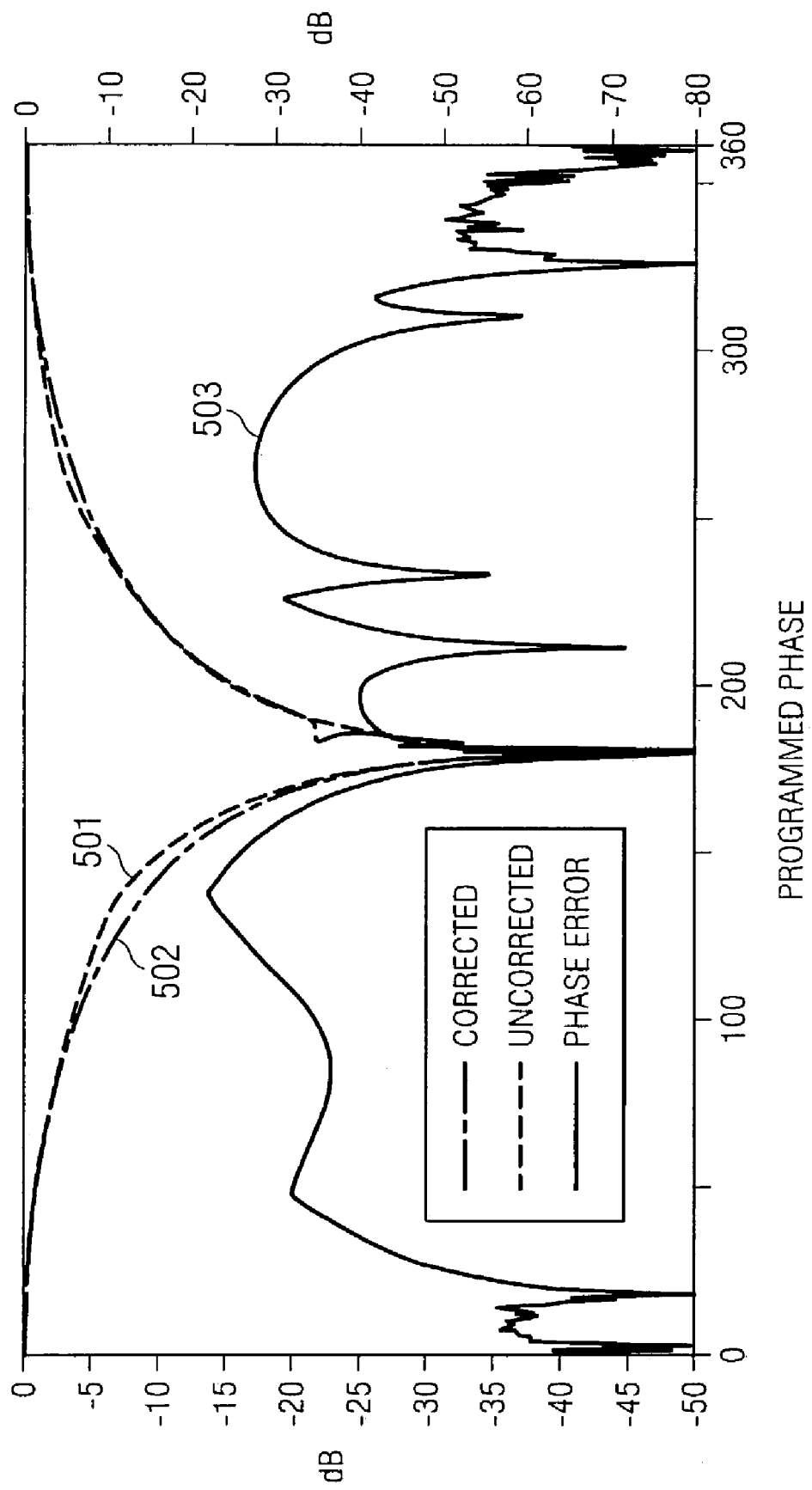
FIG. 5 shows amplitude response before and after programmed phase adjustment.

FIG. 5 shows that it is possible to find other key points from the amplitude plot, with the next most obvious being the maximum point, where the phase is mapped to 0. However, the sensitivity at the 180° point is largest. FIG. 5 shows an uncorrected plot 501 of amplitude versus phase setting, and an ideal amplitude versus phase setting plot 502 using the dB scale as combined amplitude versus phase setting. Plot 503 shows the dB difference between plot 502 and plot 501 using the right dB scale. If the multiple inputs of the balanced signal were perfectly aligned as to amplitude but 180° out of phase, the combined signal would be essentially zero. If the signals were exactly in phase, they would be double in amplitude. If the phase difference were perfectly set at each desired phase, the vector difference between the plots would be zero, thus no signal.

By noting the difference between the desired amplitude response and the actual amplitude response, the phase setting for any desired phase may be determined. Various methods may be employed to determine the correct phase setting at any particular phase, including interactive optimization approaches. Alternatively, once the 180° phase point is determined, the phase correction from the CW measurements may be applied, with appropriate offset as determined by the phase setting that causes the minimum null representing 180° of phase between the two signals. Thus, the phase can be determined using spectrum analyzers, power meters, measuring receivers, or power detectors.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for calibrating a complex modulated balanced signals, said system comprising:

a dual output signal source, the amplitude and relative phase of which may be controlled to create said complex modulated balanced signals;

a monitor monitoring said complex modulated balanced signals;

circuitry operative under control of said monitor for altering the phase relationship between the signals comprising said complex modulated balanced signals.

2. The system of claim 1 wherein said circuitry includes at least one feedback loop adjusting a control input to said signal source.

3. The system of claim 2 wherein said control input is changed to create at least one of the following, minimum phase difference, maximum phase difference, and difference from a target amplitude.

4. The system of claim 1 wherein said monitor is selected from the list comprising a:

vector network analyzer, spectrum analyzer, power meter, measuring receiver, or power detector.

5. The system of claim 4 where said monitor includes a combiner combining said complex modulated balanced signals in a known phase relationship.

6. The system of claim 5 where said combining is in-phase.

7. The system of claim 1 wherein said circuitry comprises at least one electronic signal generator (ESC) circuit having controllable I and Q inputs.

8. The system of claim 1 wherein a first one of said complex modulated balanced signals is provided by:

a first circuit for controlling the amplitude and phase of said first complex modulated balanced signal under control of control input signals, said first complex modulated balanced signal being a modification of an input signal;

a second one of said complex modulated balanced signals is provided by a second circuit for providing an output signal phase coherent with said first complex modulated balanced signal, said second circuit operable for adjusting the phase and amplitude of one of said second output signal in relationship to said first complex modulated balanced signal, said second circuit comprising circuitry for accepting said second output signal and for controlling the amplitude and phase of said second output signal under control of said control input signals to provide a second one of said complex modulated balanced signals.

9. The system of claim 8 wherein said first and second circuits are electronic signal generator (ESG) circuits, each ESG including at least one vector modulator having I and Q control inputs, and wherein a first ESG signal input is neither amplitude nor phase controlled; and wherein a second and a third ESG signal inputs are derived at least in part from at least one of the other of said ESGs.

10. The system of claim 9 wherein said I and Q inputs to said second circuit is a controllable DC input, and said system includes correction circuitry comprising adjustment circuitry controlling said DC I and Q input to said second circuit.

11. The system of claim 8 wherein said second complex modulated balanced signal has its phase and amplitude separately adjustable from the phase and amplitude of said first complex modulated balanced signal.

12. The system of claim 8 wherein said phase and amplitude of said first and second complex modulated balanced signals are controlled by vector modulators having I and Q inputs.

13. The system of claim 12 wherein the I and Q inputs to said vector modulator controlling said second output signal is a controllable DC signal.

14. A system for calibrating a balanced coupled signal, said system comprising:

a dual output signal source, the amplitude and relative phase of which may be controlled to create said balanced signal, said balanced signal having a phase relationship of zero decrees or 180 degrees;

a monitor monitoring said balanced signal;

circuitry operative under control of said monitor for altering the phase relationship between the signals comprising said balanced signal.

15. The system of claim 14 wherein a first one of said balanced signals is provided by an electronic signal generator having I and Q inputs for controlling a continuous wave (CW) input signal.

16. The system of claim 15 wherein a second one of said balanced signals is provided by an electronic signal generator having I and Q inputs for controlling a phase coherent signal from said first circuit.

17. A method for calibrating balanced signals, said method composing:

associating multiple input signals into a complex modulated balanced signal;

analyzing said complex modulated balanced signal to determine phase relationship; and continuously correcting said analyzed signal to achieve a desired relative phase.

18. The method of claim 17 wherein a first one of said complex modulated balanced signals is provided by:

controlling the amplitude and phase of said first complex modulated balanced signal under control of control input signals, said first output signal being a modification of an input signal; and adjusting the phase and amplitude of said second output signal in relationship to said first complex modulated balanced signal; and by using an output signal phase coherent with said first complex modulated balanced signal.

19. The method of claim 18 wherein said controlling and adjusting steps comprise accepting I and Q inputs.

20. The method of claim 19 wherein said I and Q inputs to said adjusting step are controllable DC inputs, and wherein said correcting step comprises the step of adjusting said controllable DC I and Q inputs.

21. A system for calibrating complex modulated balanced coupled signals, said system comprising:

means for providing, tinder control of I and Q inputs, at least two complex modulated balanced coupled signals;

means for combining said at least two complex modulated balanced coupled signals; and means for monitoring the power differential of said complex modulated balanced coupled signals as a function of phase difference there between.

22. The system of claim 21 further comprising:

a controller for adjusting at least one of said I and Q inputs and for adjusting said monitored signals in accordance with said monitored power differential.

* * * * *

UNITED STATES PATENT AND TRADEMARK OFFICE
CERTIFICATE OF CORRECTION

PATENT NO. : 7,038,465 B2  Page 1 of 1
APPLICATION NO. : 10/405533
DATED : May 2, 2006
INVENTOR(S) : Dunsmore et al.

It is certified that error appears in the above-identified patent and that said Letters Patent is hereby corrected as shown below:

In column 5, line 26, in Claim 7, delete "(ESC)" and insert -- (ESG) --, therefor.

In column 6, line 4, in Claim 14, after "balanced" delete "coupled".

In column 6, line 9, in Claim 14, delete "decrees" and insert -- degrees --, therefor.

In column 6, line 26, in Claim 17, delete "composing" and insert -- comprising --, therefor.

In column 6, line 54, in Claim 21, delete "tinder" and insert -- under --, therefor.

Signed and Sealed this

Twenty-sixth Day of September, 2006

JON W. DUDAS
*Director of the United States Patent and Trademark Office*